US009013937B2

(12) United States Patent
Yoneda

(10) Patent No.: US 9,013,937 B2
(45) Date of Patent: Apr. 21, 2015

(54) SEMICONDUCTOR DEVICE, METHOD FOR INSPECTING THE SAME, AND METHOD FOR DRIVING THE SAME

(71) Applicant: Semiconductor Energy Laboratory Co., Ltd., Kanagawa-ken (JP)

(72) Inventor: Seiichi Yoneda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/295,816

(22) Filed: Jun. 4, 2014

(65) Prior Publication Data

US 2014/0286114 A1 Sep. 25, 2014

Related U.S. Application Data

(62) Division of application No. 13/211,611, filed on Aug. 17, 2011, now Pat. No. 8,750,058.

(30) Foreign Application Priority Data

Aug. 19, 2010 (JP) ................................. 2010-183748

(51) Int. Cl.
*G11C 7/00* (2006.01)
*G11C 29/04* (2006.01)
*G11C 7/10* (2006.01)
*G11C 29/00* (2006.01)

(52) U.S. Cl.
CPC .............. *G11C 29/04* (2013.01); *G11C 7/1009* (2013.01); *G11C 29/702* (2013.01)

(58) Field of Classification Search
USPC ........................ 365/200, 201, 189.17, 189.16
See application file for complete search history.

(56) References Cited

U.S. PATENT DOCUMENTS

| 5,097,445 | A | | 3/1992 | Yamauchi |
| 5,297,029 | A | * | 3/1994 | Nakai et al. ................ 365/238.5 |
| 5,402,377 | A | | 3/1995 | Ohhata et al. |
| 5,452,251 | A | | 9/1995 | Akaogi et al. |
| 5,621,683 | A | | 4/1997 | Young |
| 6,041,000 | A | | 3/2000 | McClure et al. |
| 6,219,280 | B1 | | 4/2001 | Naganawa |
| 6,284,406 | B1 | | 9/2001 | Xing et al. |
| 6,362,502 | B1 | | 3/2002 | Rosner et al. |
| 6,525,976 | B1 | | 2/2003 | Johnson |
| 6,563,749 | B2 | | 5/2003 | Ferrant |
| 6,577,534 | B2 | | 6/2003 | Tsuruda |

(Continued)

FOREIGN PATENT DOCUMENTS

| JP | 62-160554 A | 7/1987 |
| JP | 62-165254 A | 7/1987 |

(Continued)

*Primary Examiner* — Han Yang
(74) *Attorney, Agent, or Firm* — Husch Blackwell LLP

(57) ABSTRACT

A method for limiting writing of data to a specific memory cell without disconnecting a wiring of a memory cell array or placing a prober in contact with a memory cell, a row, or a column is provided. Row address data and column address data of a memory cell to which data cannot be written are stored in a register. Enable data which controls data writing is stored in the register. Next, in order to write data to a memory cell, row address data and column address data of a memory cell to which data is written, writing enable data, and the like are output from a logic circuit; thus, writing of data to a memory cell corresponding to the address data stored in the register is inhibited.

11 Claims, 8 Drawing Sheets

(56) References Cited

U.S. PATENT DOCUMENTS

| | | |
|---|---|---|
| 6,819,604 B2 | 11/2004 | Yamada |
| 6,879,529 B2 | 4/2005 | Yamada |
| 6,967,878 B2 | 11/2005 | Dono |
| 7,030,714 B2 | 4/2006 | Korol |
| 7,239,564 B2 | 7/2007 | Mutaguchi |
| 7,294,209 B2 | 11/2007 | Shakespeare |
| 7,719,872 B2 | 5/2010 | Kato |
| 7,773,436 B2 | 8/2010 | Inoue et al. |
| 7,816,721 B2 | 10/2010 | Yamazaki et al. |
| 2006/0140027 A1* | 6/2006 | Tominaga .................... 365/200 |
| 2007/0103998 A1* | 5/2007 | Ishikawa .................... 365/200 |
| 2007/0147129 A1 | 6/2007 | Kato |
| 2008/0151660 A1 | 6/2008 | Inoue et al. |
| 2008/0205146 A1 | 8/2008 | Kajigaya |
| 2010/0034037 A1 | 2/2010 | Tabata |
| 2010/0238706 A1 | 9/2010 | Tokiwa et al. |
| 2010/0251043 A1 | 9/2010 | Anzou |
| 2010/0302887 A1 | 12/2010 | Inoue et al. |

FOREIGN PATENT DOCUMENTS

| | | |
|---|---|---|
| JP | 02-230444 A | 9/1990 |
| JP | 05-342038 A | 12/1993 |
| JP | 2000-173279 A | 6/2000 |
| JP | 2005-174533 A | 6/2005 |
| JP | 2008-217848 A | 9/2008 |
| JP | 2010-225239 A | 10/2010 |

* cited by examiner

SEMICONDUCTOR DEVICE, METHOD FOR INSPECTING THE SAME, AND METHOD FOR DRIVING THE SAME

BACKGROUND OF THE INVENTION

This application is a divisional of copending U.S. application Ser. No. 13/211,611, filed on Aug. 17, 2011 which is incorporated herein by reference.

1. Field of the Invention

The present invention relates to semiconductor devices.

2. Description of the Related Art

The more a memory device is increased in capacity, the higher the probability of existence of defective memory cells becomes. For this reason, in some cases, a redundant memory is provided in a large-capacity memory device so that defective memory cells are replaced with memory cells in the redundant memory (redundant memory cells). Specifically, there is a method for disconnecting defective memory cells from peripheral circuits with the use of a laser and connecting normal memory cells in a redundant memory to the peripheral circuits with the use of a laser in pre-shipment inspection.

Further, as for defective memory cells which are not inspected in pre-shipment inspection and generated after shipment, a circuit which automatically replaces the defective memory cells with redundant memory cells without the use of a laser (hereinafter referred to as a redundant circuit) is provided. Thus, the life of products is prolonged and the reliability is improved in some cases (see Patent Document 1).

In the case where a redundant circuit is provided, the function of the redundant circuit needs to be inspected before shipment. For that purpose, defective memory cells need to be intentionally manufactured by making normal memory cells incapable of being written, for example. As an example of the method, a first method for disconnecting a wiring connected to a memory cell with the use of a laser and a second method for probing a wiring connected to a memory cell and supplying a fixed voltage can be given.

An example of the first method is described with reference to FIG. 2A showing an example of an anti-fuse memory device. A memory cell shown in FIG. 2A fundamentally has a normal function. The memory cell is temporarily or permanently made incapable of being written.

In the memory cell shown in FIG. 2A, a bit line 101 is connected to one of a source and a drain of an n-channel select transistor 104 through a wiring 102; a word line 103 is connected to a gate of the select transistor 104; one end of an anti-fuse element 105 is connected to the other of the source and the drain of the select transistor 104, and the other end of the anti-fuse element 105 is grounded.

At the time of inspecting the function of a redundant circuit, the wiring 102 is disconnected with a laser. Thus, even when a writing voltage is applied to the bit line 101, the writing voltage is not applied to the anti-fuse element 105, resulting in a failure of the writing.

When the redundant circuit functions normally, the failure of writing data to the memory cell is detected, the memory cell is replaced with a redundant memory cell, and data is written to the redundant memory cell. Normal data can be read from the redundant memory cell.

When the redundant circuit does not function normally and there is a failure of data writing, the memory cell is not replaced with the redundant memory cell and data is written to nowhere as a result. Consequently, normal data cannot be read. In such a manner, whether the redundant circuit functions normally or not can be judged.

An example of the second method is shown in FIG. 2B. A memory cell shown in FIG. 2B has the same configuration as the memory cell shown in FIG. 2A. Note that at the time of inspecting the function of a redundant circuit, one end of a prober 106 the other end of which is grounded is placed in contact with the word line 103. Thus, a ground potential is applied to the gate of the select transistor 104, so that the select transistor 104 is not turned on. Thus, even when a writing voltage is applied to the bit line 101, the writing voltage is not applied to the anti-fuse element 105, resulting in a failure of the writing.

A memory cell incapable of being written is intentionally manufactured and data is written and read as described above; thus, whether a redundant circuit functions normally or not can be judged.

REFERENCE

Patent Document

[Patent Document 1] Japanese Published Patent Application No. 2005-174533

SUMMARY OF THE INVENTION

A redundant circuit can be inspected in the above manner but there are the following problems. First, in the first method, it is difficult to reuse a memory cell in which a wiring is disconnected. The above problem can be solved by replacing the memory cell with a normal memory cell in a redundant memory with the use of a laser; however, there is a problem in that the number of operational redundant memory cells is reduced when a defective memory cell is generated after shipment. There is also a problem in that an inspection process is complicated because a step with a laser is necessary.

In the second method, there is a problem in that other memory cells in a probed wiring (a bit line or a word line) are also made incapable of being written, so that the accuracy of inspection deteriorates. Further, in the case where memory cells in different bit lines or word lines are made incapable of being written concurrently, the number of probers needs to be the same as the number of memory cells which are made incapable of being written; therefore, there is a problem in that as the number of the memory cells which are made incapable of being written is increased, the inspection process becomes complicated.

In addition, in both of the first method and the second method, wirings which are not inspection targets might be damaged with laser treatment or probing by mistake. This problem increases as the width of wirings becomes narrower by higher integration of a memory device.

An object of one embodiment of the present invention is to provide a method for inspecting a redundant function without disconnecting or probing a wiring (a memory wiring) such as a word line or a bit line in a memory device. Further, a driving method in which writing of data to one or more certain memory cells is inhibited without disconnecting or probing a wiring (a memory wiring) such as a word line or a bit line in a memory device is provided.

In one embodiment of the present invention, in addition to the above objects, it is an object to provide a novel semiconductor device (specifically a memory device). Further, an object is to provide a method for driving a novel semiconductor device (specifically a method for driving a memory device) or a method for inspecting a novel semiconductor device (specifically a method for inspecting a memory device). In the present invention, at least one of the above-described objects is achieved.

One embodiment of the present invention is a method for inspecting a semiconductor device using a circuit including a register storing address data of a memory cell in which data writing is inhibited and a logic circuit inhibiting writing of data to the memory cell on the basis of address data stored in the register or a method for driving such a semiconductor device.

Further, one embodiment of the present invention is a method for inspecting a semiconductor device including a register and a main logic circuit or a method for driving such a semiconductor device. A step of storing address data of a memory cell in which data writing is inhibited, a step of outputting address data from the main logic circuit, and a step of comparing the address data stored in the register with the address data output from the main logic circuit are included in the method for inspecting the semiconductor device or the method for driving the semiconductor device.

When the method for inspecting the semiconductor device or the method for driving the semiconductor device is carried out, it is necessary to send data to the register. For that purpose, an inspection pad may be additionally provided and the inspection pad may be probed to send data.

The above methods can be used for all the memory devices including writing circuits. Further, the above methods can be used for memory devices such as a DRAM, an SRAM, an OTPROM, an EPROM, an FeRAM, an MRAM, and a PRAM. Furthermore, the above methods can be used for a semiconductor device including any of these memory devices over one substrate.

With the use of the above circuit, a redundant function can be inspected without disconnecting or probing a memory wiring. Note that the present invention is not limited to the above embodiments and other embodiments of the present invention which can solve the above objects are described in the following embodiments below.

According to one embodiment of the present invention, a redundant function can be inspected without disconnecting or probing a memory wiring. In the first method using a laser, it is difficult to reuse a memory cell in which a wiring is disconnected; however, this problem do not occur in one embodiment of the present invention because a wiring is not disconnected. Further a problem of a complicated inspection process due to the need for a step with a laser can be solved.

In addition, in the second method using a prober, when a specific memory cell is made incapable of being written, the other memory cells in the same bit line or the same word line are made incapable of being written, so that the accuracy of inspection deteriorates. However, a certain memory cell can be specified and data writing to the memory cell is inhibited in one embodiment of the present invention, whereby this problem can be solved.

Further, a problem of damaging wirings which are not inspection targets with laser treatment or probing by mistake can be solved. Furthermore, a problem of a complicated inspection process due to an increase in the number of memory cells which are made incapable of being written can be solved.

In particular, a great effect can be obtained in a highly-integrated large capacity memory in which the width of wirings is narrow and it is difficult to disconnect wirings with the use of a laser or to probe wirings. For example, the accuracy of a processing with the use of a laser is about a wavelength of a laser to be used. In addition, the processing cannot be carried out in the case where the width of wirings is less than or equal to 400 nm in consideration of the impact of heat at the time of the processing.

Similarly, when probing is performed, there is a significant technical difficulty in the case where the width of wirings is less than or equal to 200 nm. For these reasons, one embodiment of the present invention is preferably used for a memory device in which the width of wirings is less than or equal to 200 nm.

DETAILED DESCRIPTION OF THE INVENTION

Figure 1:
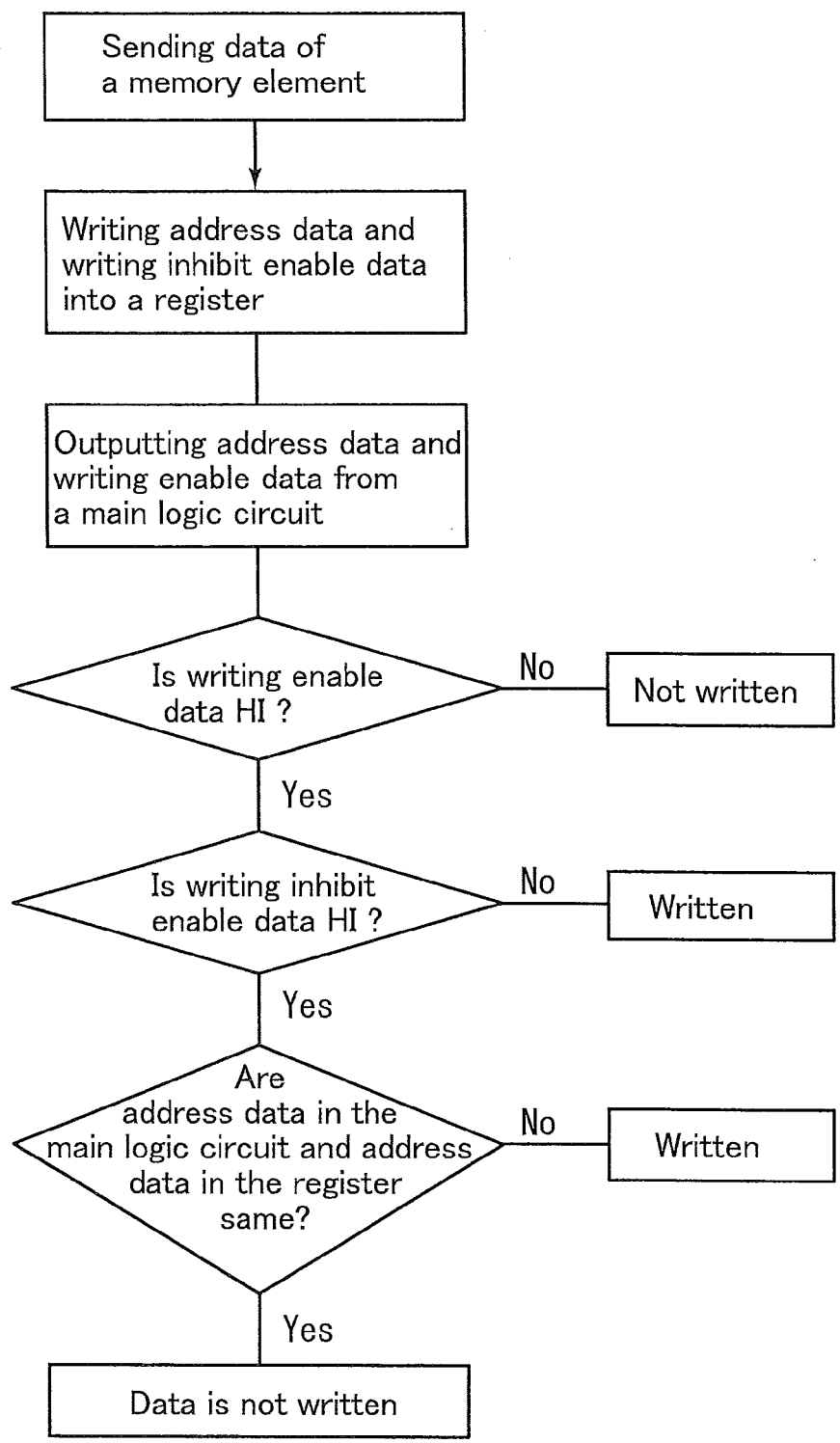
FIG. 1 is a flow chart showing a logical structure for inhibiting writing of data to a memory cell.
Figure 2A:
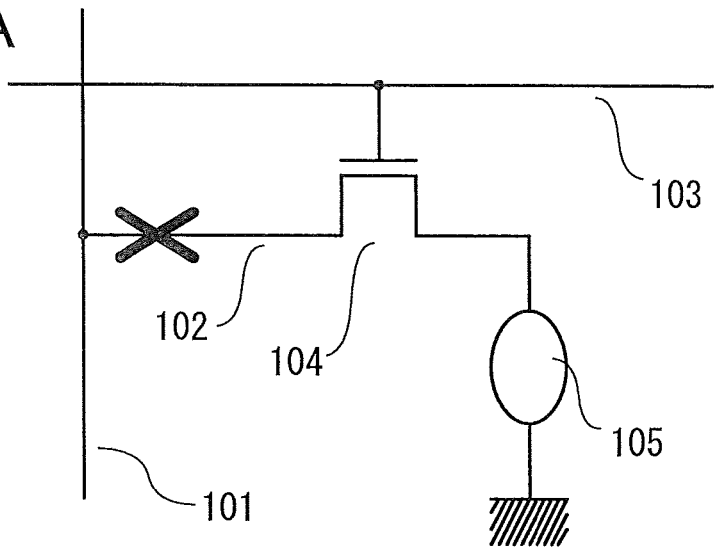
FIGS. 2A and 2B show a conventional method for inhibiting writing of data to a memory cell.
Figure 2B:
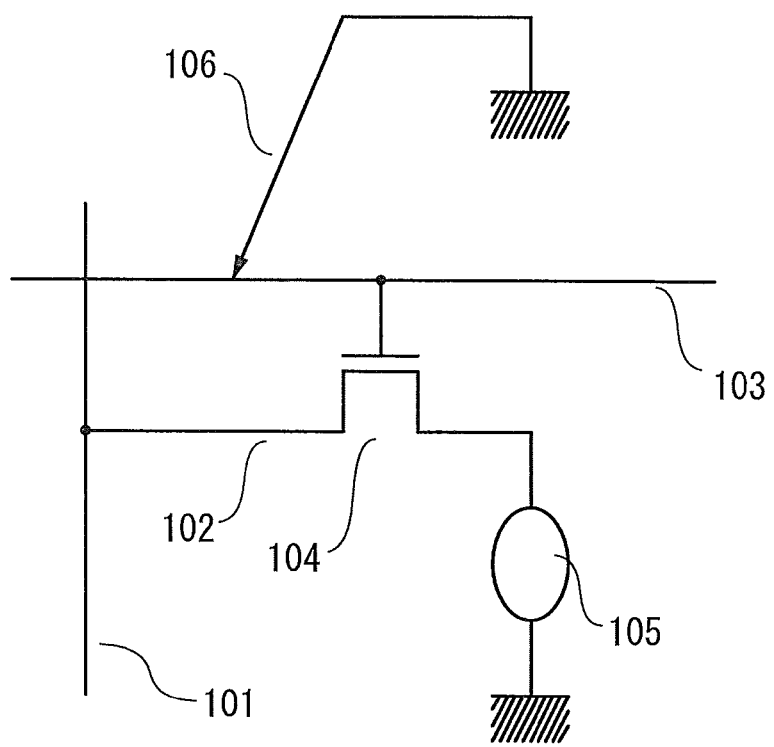

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

The structures, the conditions, and the like disclosed in any of the following embodiments can be combined with those disclosed in other embodiments as appropriate. Note that in the structures described below, the same portions or portions having similar functions are denoted by the same reference numerals in different drawings, and detailed description thereof is not repeated in some cases.

(Embodiment 1)

Figure 3A:
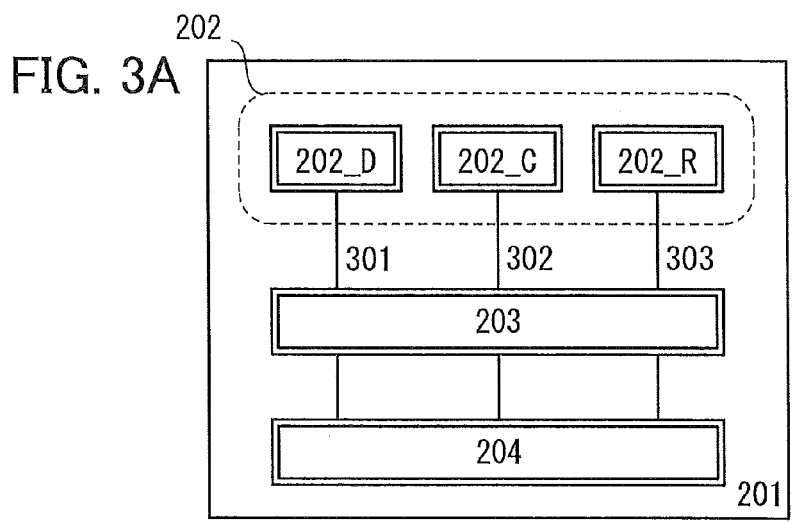
FIGS. 3A to 3C show examples of circuits of the present invention.

In this embodiment, an example of a device used in a method for inspecting a redundant function without disconnecting or probing a memory wiring is described with reference to FIGS. 3A to 3C. In FIG. 3A, a writing inhibit circuit 201 includes an inspection pad 202, a register 203, and a writing inhibit logic circuit 204. These circuits are provided over a semiconductor device (an integrated circuit) to be inspected.

The inspection pad 202 is used for sending data to the register 203 and specifically, a prober is placed in contact with the inspection pad 202 and data is sent to the register 203.

The inspection pad 202 may include at least three inspection pads. For example, an inspection pad 202_D for inputting a data signal, an inspection pad 202_C for inputting a clock signal, and an inspection pad 202_R for inputting a reset signal are included as shown in FIG. 3A. Thus, in the case where a plurality of inspection pads is provided, the inspection pads have different uses in some cases; however, in this embodiment, the inspection pads are collectively called the inspection pad 202 in some cases.

Signals input to these inspection pads 202_D, 202_C, and 202_R are sent to the register 203 through a data signal line 301, a clock signal line 302, and a reset signal line 303 respectively. Note that the data signal line 301, the clock signal line 302, and the reset signal line 303 are connected to the register 203 in FIG. 3A; however, these signal lines are collectively shown as one signal line in other drawings in some cases.

Further, signals in the integrated circuit can be used as a clock signal and a reset signal instead of signals obtained from the inspection pads. Consequently, a configuration can be employed in which either or both the inspection pad 202_C for inputting a clock signal and the inspection pad 202_R for inputting a reset signal are not provided.

Any kind of device can be used for the register 203 as long as it can store input data and output the data. For example, a device in which D flip-flop circuits are combined as shown in FIG. 3C may be used. In FIG. 3C, N (N is an integer more than or equal to 1) D flip-flop circuits 304_1, 304_2, 304_3 . . . and 304_N are connected in series. The clock signal line 302 and the reset signal line 303 are connected to the D flip-flop circuits, and a clock signal and a reset signal are input to the clock signal line 302 and the reset signal line 303 respectively.

The data signal line 301 is connected to the D flip-flop circuit 304_1 in the first stage. An output of the D flip-flop circuit in the previous stage is input to the other D flip-flop circuit. The output of each of the D-flip-flop circuits is any of writing inhibit enable data 218, writing inhibit column address data 219, and writing inhibit row address data 220. This depends on the order of data input from the data signal line 301.

Data sent to the register 203 is processed in the writing inhibit logic circuit 204 and the writing inhibit logic circuit 204 outputs data including a signal which inhibits data writing.

Figure 3B:
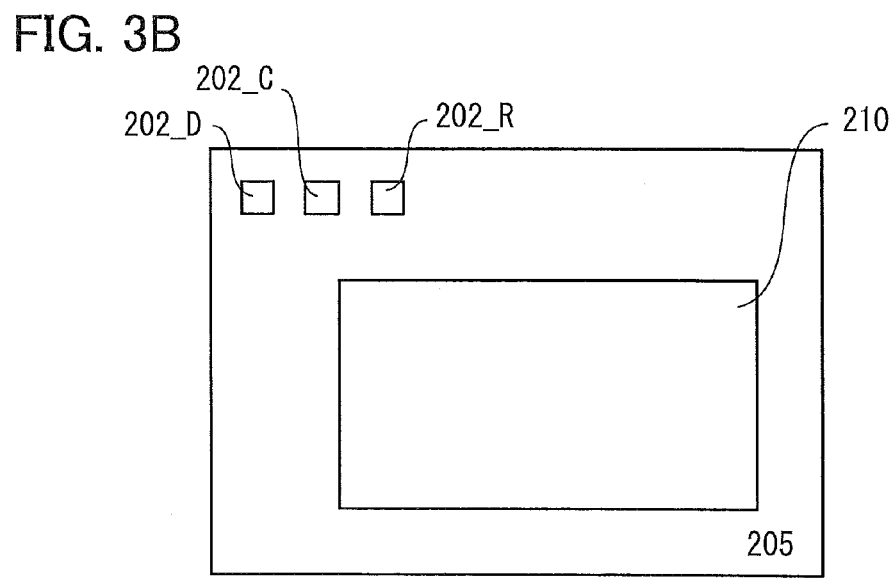
Figure 3C:
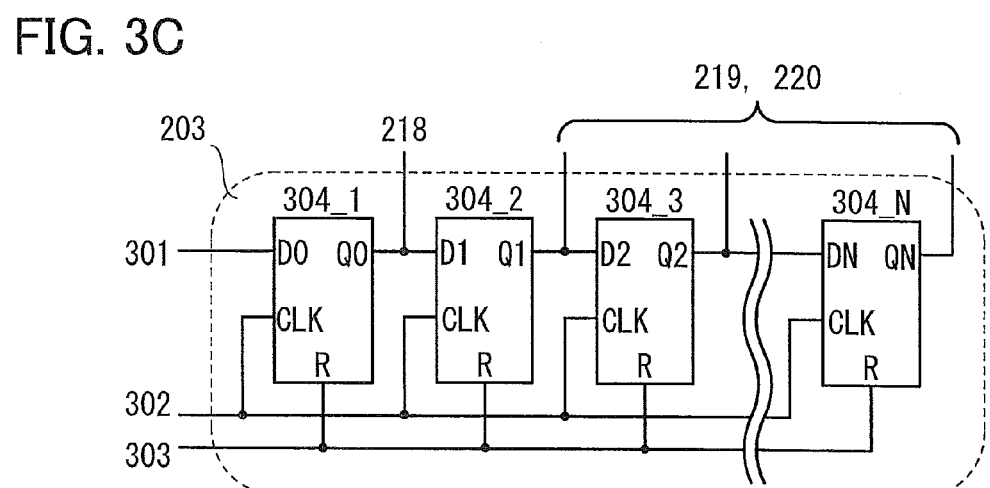

The writing inhibit circuit 201 is formed over an integrated circuit 205 including a memory cell array 210 as shown in FIG. 3B. In the writing inhibit circuit 201, the register 203 and the writing inhibit logic circuit 204 are formed in a manner similar to that of the other circuits over the integrated circuit 205; therefore, the register 203 and the writing inhibit logic circuit 204 are not shown here. In order to perform probing easily, it is preferable to increase the area of the inspection pads 202_D, 202_C, and 202_R as long as the integration degree of the integrated circuit is acceptable.

Figure 4:
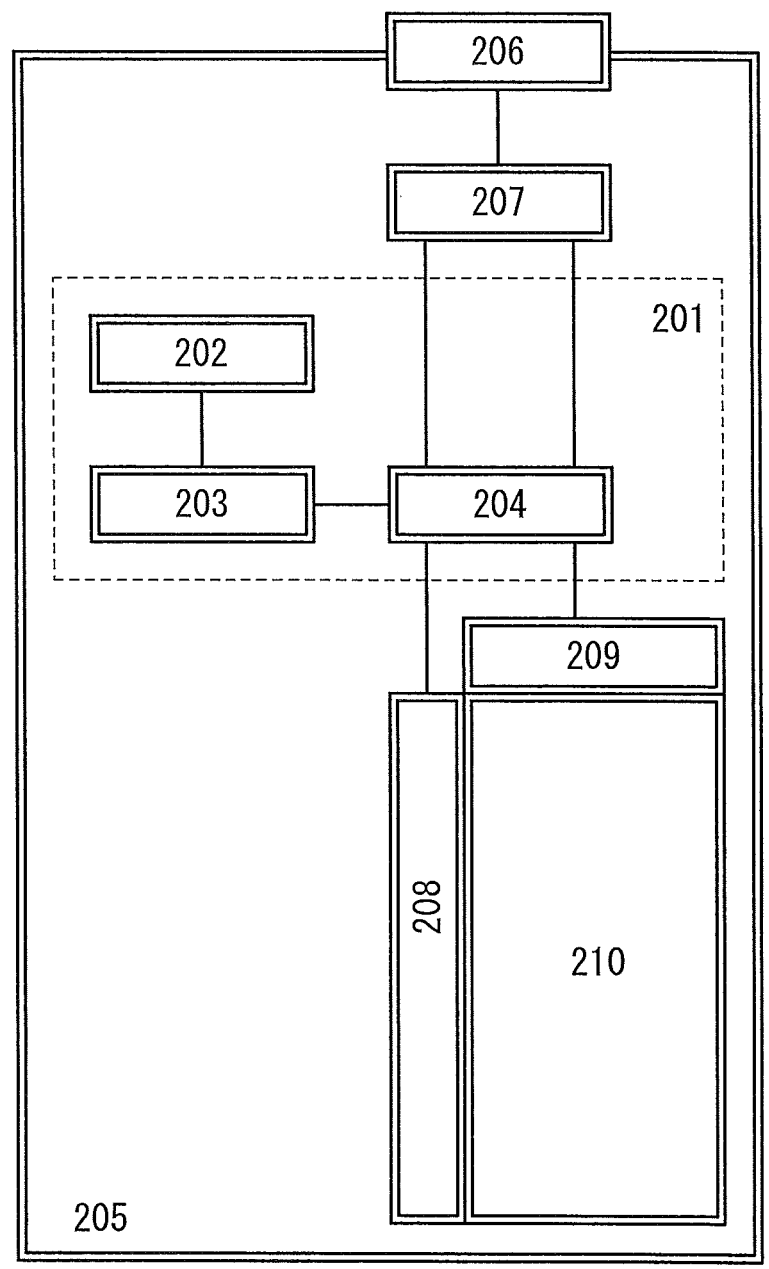
FIG. 4 shows examples of circuits of the present invention.

A circuit configuration of the integrated circuit 205 including a circuit inspecting a redundant function is described with reference to FIG. 4. The integrated circuit 205 includes the writing inhibit circuit 201, an interface 206, a main logic circuit 207, a row decoder 208, a column decoder 209, and the memory cell array 210. The writing inhibit circuit 201 includes the inspection pad 202, the register 203, and the writing inhibit logic circuit 204.

The main logic circuit 207 has a function of writing data to the memory cell array 210 and a redundant function of replacing a memory cell in which data writing has failed with a redundant memory cell. The writing inhibit logic circuit 204 has a function of inhibiting data writing when the main logic circuit 207 writes data to an address, which corresponds to address data stored in the register 203 in the memory cell array 210.

The redundant function is inspected in the following manner. The inspection pad 202 is probed and address data of a memory cell in which data writing is inhibited is stored in the register 203. Next, data is written to an address corresponding to the address data stored in the register 203 in the memory cell array 210 by the main logic circuit 207. As a result, this data writing fails because the data writing is inhibited due to the function of the writing inhibit logic circuit 204. The main logic circuit 207 detects the failure of the data writing and the memory cell in which the data writing has failed is replaced with a redundant memory cell by the redundant function of the main logic circuit 207.

As described above, a redundant function can be inspected without disconnecting or probing a memory wiring.

(Embodiment 2)

An example of a specific circuit configuration of a writing inhibit logic circuit when a writing inhibit circuit is mounted on an integrated circuit including a general memory device in Embodiment 1 is described with reference to FIG. 7. Note that in this embodiment, a column address and a row address of a memory device are each described with 2 bits.

Figure 7:
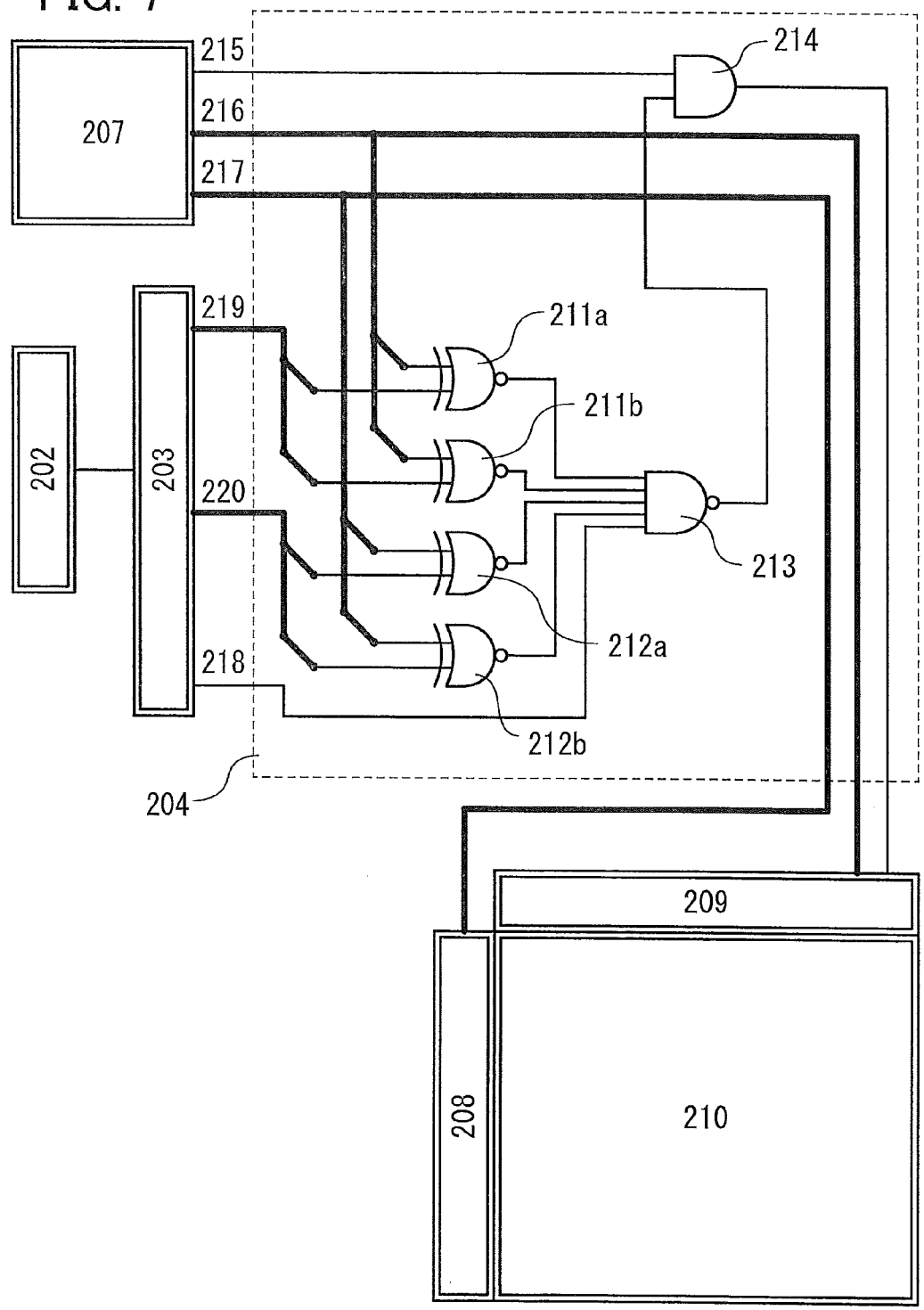
FIG. 7 shows examples of circuits of the present invention.

In FIG. 7, the integrated circuit includes the main logic circuit 207, the row decoder 208, the column decoder 209, the memory cell array 210, the inspection pad 202, the register 203, and the writing inhibit logic circuit 204. Data can be input from an external portion to the main logic circuit 207 through an interface (not shown). As described in Embodiment 1, data input from the inspection pad 202 is stored in the register 203.

Writing inhibit enable data 218, writing inhibit column address data 219, and writing inhibit row address data 220 are output from the register 203. The main logic circuit 207 has the function of writing data to the memory cell array 210 and the redundant function of replacing a memory cell in which data wiring has failed with a redundant memory cell in the case of the failure of data writing. The main logic circuit 207 outputs writing enable data 215, writing column address data 216, and writing row address data 217.

The writing inhibit logic circuit 204 includes an XNOR gate 211a, an XNOR gate 211b, an XNOR gate 212a, an XNOR gate 212b, a NAND gate 213, and an AND gate 214. The most significant bit (MSB) of the writing column address data 216 and MSB of the writing inhibit column address data 219 are input to the XNOR gate 211a. The least significant bit (LSB) of the writing column address data 216 and LSB of the writing inhibit column address data 219 are input to the XNOR gate 211b. MSB of the writing row address data 217 and MSB of the writing inhibit row address data 220 are input to the XNOR gate 212a. LSB of the writing row address data 217 and LSB of the writing inhibit row address data 220 are input to the XNOR gate 212b.

An output signal of the XNOR gate 211a, an output signal of the XNOR gate 211b, an output signal of the XNOR gate 212a, an output signal of the XNOR gate 212b, and the writing inhibit enable data 218 are input to the NAND gate 213.

The writing enable data 215 and an output signal of the NAND gate 213 are input to the AND gate 214. The writing column address data 216 and an output signal of the AND gate 214 are input to the column decoder 209. The writing row address data 217 is input to the row decoder 208.

Operation in this case is described with reference to a flow chart shown in FIG. 1. First, the inspection pad 202 is probed and column address data and row address data of a memory cell in which data writing is inhibited are stored in the register 203. In addition, enable data for inhibiting data writing is stored in the register 203.

Next, in order to write data to the memory device, column address data of a memory cell to which data is written, row address data of the memory cell to which data is written, and writing enable data are output from the main logic circuit 207. At this time, when the writing enable data is LOW, data is not written. When the writing enable data is HI, the following processing is performed.

When writing inhibit enable data is LOW, data is written normally. When the writing inhibit enable data is HI, the address data which is stored in the register 203 is compared with the address data which is output from the logic circuit 207. When the address data are different from each other, data is written normally. When the address data are the same, data is not written.

Through the above operation, writing data to an address in a memory cell corresponding to address data stored in a register is inhibited. In the case where the failure of the data writing is detected, the memory cell is replaced with a redundant memory cell by the redundant function. If the redundant function is normal, data is written to the redundant memory cell. In such a manner, the redundant function can be inspected.

In the memory device of this embodiment, a column address and a row address are each described with 2 bits; however, when the semiconductor device of this embodiment is extended with the use of an appropriate number of XNOR gates, the semiconductor device of this embodiment can be applied to a memory device in which a column address and a row address are each described with an arbitrary number of bits. For example, in the case where a column address is described with 3 bits, the number of the XNOR gates (211a and 211b) in FIG. 7 may be changed from two to three, and in the case where a row address is described with 4 bits, the number of the XNOR gates (212a and 212b) in FIG. 7 may be changed from two to four.

(Embodiment 3)

In Embodiment 1, address data can be stored through the logic circuit in the integrated circuit without the use of the inspection pad. A configuration of the semiconductor device in this case is described with reference to FIG. 5.

Figure 5:
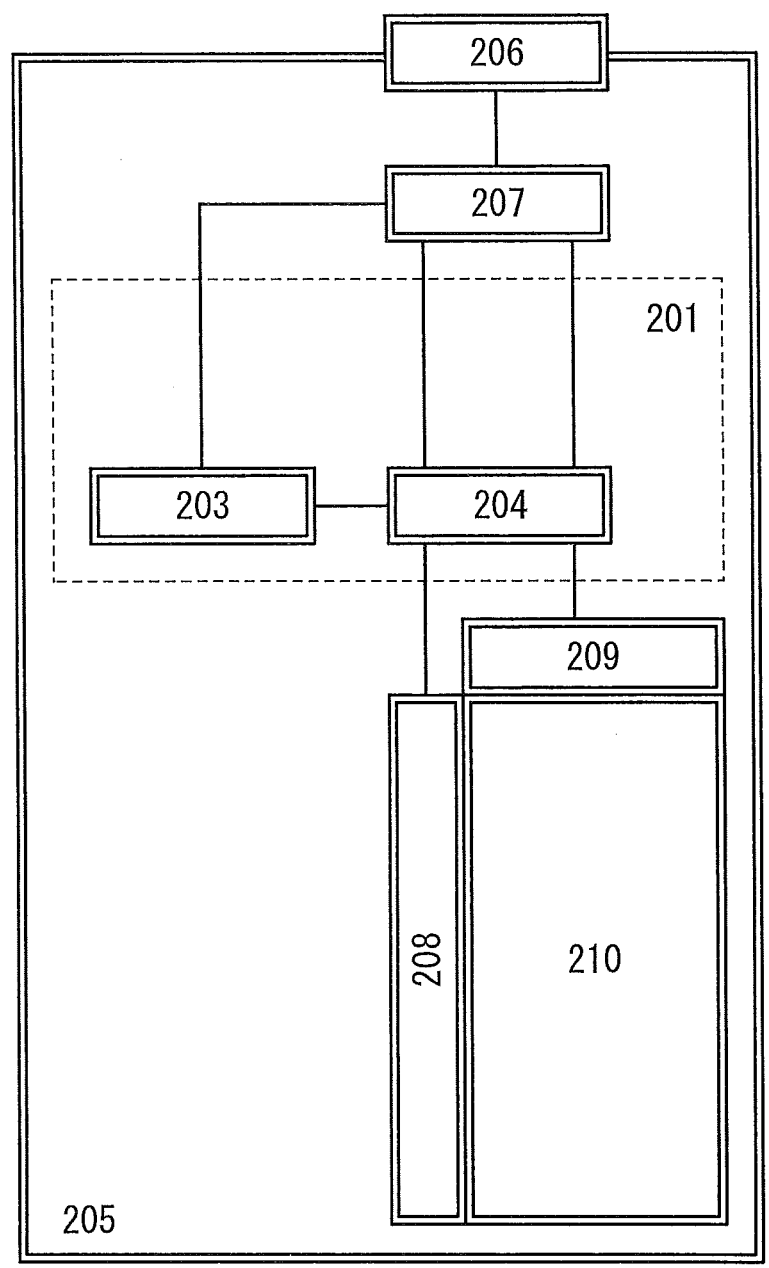
FIG. 5 shows examples of circuits of the present invention.

In FIG. 5, the integrated circuit 205 includes the writing inhibit circuit 201, the interface 206, the main logic circuit 207, the row decoder 208, the column decoder 209, and the memory cell array 210. The writing inhibit circuit 201 includes the register 203 and the writing inhibit logic circuit 204.

The main logic circuit 207 has the function of sending data of a memory cell in which data writing is inhibited to the register 203, the function of writing data to the memory cell array 210, and the redundant function of replacing a memory cell in which data writing has failed with a redundant memory cell in the case of the failure of writing data to the memory cell array 210.

The writing inhibit logic circuit 204 has the function of inhibiting data writing when the main logic circuit 207 writes data to an address, which corresponds to address data stored in the register 203 in the memory cell array 210.

The semiconductor device of this embodiment may be driven in the following manner. First, address data of a memory cell in which data writing is inhibited is input from the interface 206. Then, the main logic circuit 207 stores the input data in the register 203. Next, data is written to an address corresponding to address data stored in the register 203 in the memory cell array 210 by the main logic circuit 207.

This data writing is inhibited by a function of the writing inhibit logic circuit 204, so that this data writing fails as a result. The main logic circuit 207 detects the failure of the data writing and the memory cell in which the data writing has failed is replaced with a redundant memory cell by the redundant function of the main logic circuit 207.

As described above, a redundant function can be inspected without disconnecting or probing a memory wiring. In addition, inspection can be performed without probing an inspection pad, whereby an inspection process can be simplified.

In the case where the integrated circuit 205 is mounted on an electronic appliance (for example, an RF tag (an RFID tag) or a non-contact IC card) which does not have a function of exchanging data with an external portion with contact, it is necessary to wirelessly supply power supply voltage, signal, and the like required for driving the integrated circuit 205 and to inspect the redundant function of the main logic circuit 207 with no probing. Such an inspection can be realized by using this embodiment.

Note that at this time, it is preferable to set a command for the inspection in this embodiment in an electronic appliance such as an RF tag or a non-contact IC card and make the electronic appliance react appropriately.

(Embodiment 4)

Embodiment 2 is based on the premise that data writing to one memory cell (1 bit) is inhibited. Needless to say, data writing to a plurality of memory cells can be inhibited. In this embodiment, an example of data writing to two memory cells (2 bits) is inhibited is described. In a similar manner, data writing to three or more memory cells can be inhibited.

Figure 8:
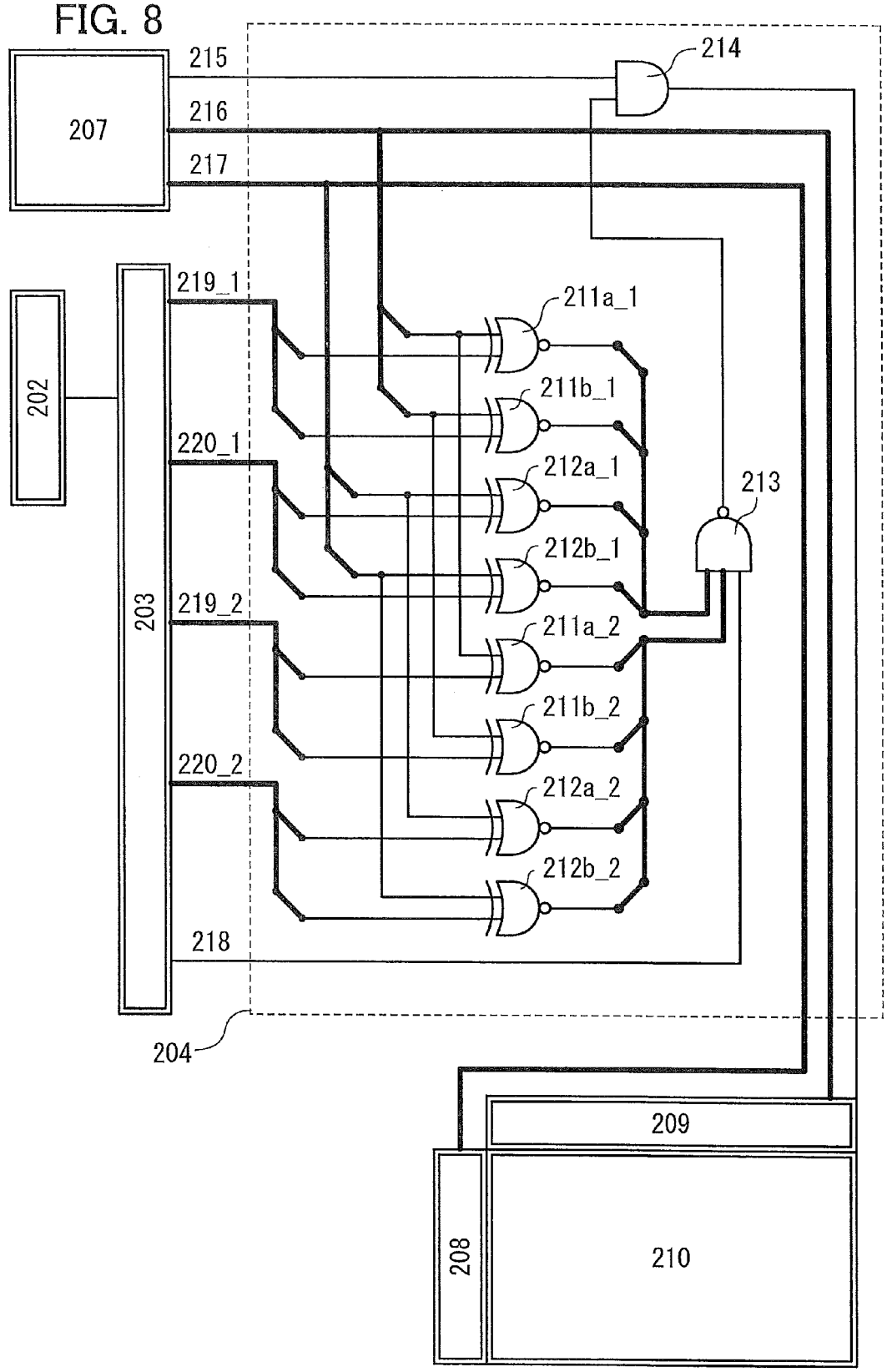
FIG. 8 shows examples of circuits of the present invention.

An integrated circuit shown in FIG. 8 includes the main logic circuit 207, the row decoder 208, the column decoder 209, the memory cell array 210, the inspection pad 202, the register 203, and the writing inhibit logic circuit 204. Data is input from an external portion to the main logic circuit 207 through an interface (not shown). As the register 203, the D flip-flop circuits connected in series as shown in FIG. 3C may be used, for example.

Writing inhibit enable data 218, first writing inhibit column address data 219_1, first writing inhibit row address data 220_1, second writing inhibit column address data 219_2, and second writing inhibit row address data 220_2 are output from the register 203. These are input to the register 203 from the inspection pad 202 and are stored in the register 203.

The first writing inhibit column address data 219_1 and the first writing inhibit row address data 220_1 correspond to an address of a first memory cell in which data writing is inhibited. The second writing inhibit column address data 219_2 and the second writing inhibit row address data 220_2 correspond to an address of a second memory cell in which data writing is inhibited.

The main logic circuit 207 has the function of writing data to the memory cell array 210 and the redundant function of replacing a memory cell in which data writing has failed with a redundant memory cell in the case of the failure of data writing. The main logic circuit 207 outputs the writing enable data 215, the writing column address data 216, and the writing row address data 217.

Further, the writing inhibit logic circuit 204 includes an XNOR gate 211a_1, an XNOR gate 212a_1, an XNOR gate 211b_1, an XNOR gate 212b_1, an XNOR gate 211a_2, an XNOR gate 212a_2, an XNOR gate 211b_2, an XNOR gate 212b_2, a NAND gate 213, and an AND gate 214.

As shown in FIG. 8, MSB of the writing column address data 216 and MSB of the writing inhibit column address data 219_1 are input to the XNOR gate 211a_1. LSB of the writing column address data 216 and LSB of the writing inhibit column address data 219_1 are input to the XNOR gate 211b_1. MSB of the writing row address data 217 and MSB of the writing inhibit row address data 220_1 are input to the XNOR gate 212a_1. LSB of the writing row address data 217 and LSB of the writing inhibit row address data 220_1 are input to the XNOR gate 212b_1. MSB of the writing column address data 216 and MSB of the writing inhibit column address data 219_2 are input to the XNOR gate 211a_2. LSB of the writing column address data 216 and LSB of the writing inhibit column address data 219_2 are input to the XNOR gate 211*b*_2. MSB of the writing row address data 217 and MSB of the writing inhibit row address data 220_2 are input to the XNOR gate 212*a*_2. LSB of the writing row address data 217 and LSB of the writing inhibit row address data 220_2 are input to the XNOR gate 212*b*_2.

An output signal of the XNOR gate 211*a*_1, an output signal of the XNOR gate 212*a*_1, an output signal of the XNOR gate 211*b*_1, an output signal of the XNOR gate 212*b*_1, an output signal of the)(NOR gate 211*a*_2, an output signal of the XNOR gate 212*a*_2, an output signal of the XNOR gate 211*b*_2, an output signal of the XNOR gate 212*b*_2, and writing inhibit enable data 218 are input to the NAND gate 213. The writing enable data 215, an output signal of the NAND gate 213 are input to the AND gate 214.

The writing row address data 217 is input to the row decoder 208. The writing column address data 216 and an output signal of the AND gate 214 are input to the column decoder 209.

In the case where data writing to three or more memory cells (3 bits or more) is inhibited, the number of sets of the XNOR gate 211*a*, the XNOR gate 211*b*, the XNOR gate 212*a*, and the XNOR gate 212*b* is preferably the same as the number of bits.

When the above-described semiconductor device is used, the number of required probers is the same as the number of probers required for probing regardless of the number of memory cells in which data writing is inhibited. Consequently, a conventional problem in that the entire inspection steps of the inspection are complicated as the number of memory cells in which data writing is inhibited is increased is solved.

(Embodiment 5)

In Embodiment 1, when a plurality of inspection pads are provided according to the number of memory cells required for specifying an address, writing of data to the corresponding address is inhibited without provision of a register. Specifically, when data writing is inhibited to N memory cells in a memory device in which a row address and a column address are described with R bits and C bits respectively, the number of inspection pads may be [(R+C)×N+1]. Writing inhibit enable data is input to one inspection pad and either row address data or column address data of a memory cell in which writing data is inhibited is input to the other inspection pads.

Figure 6:
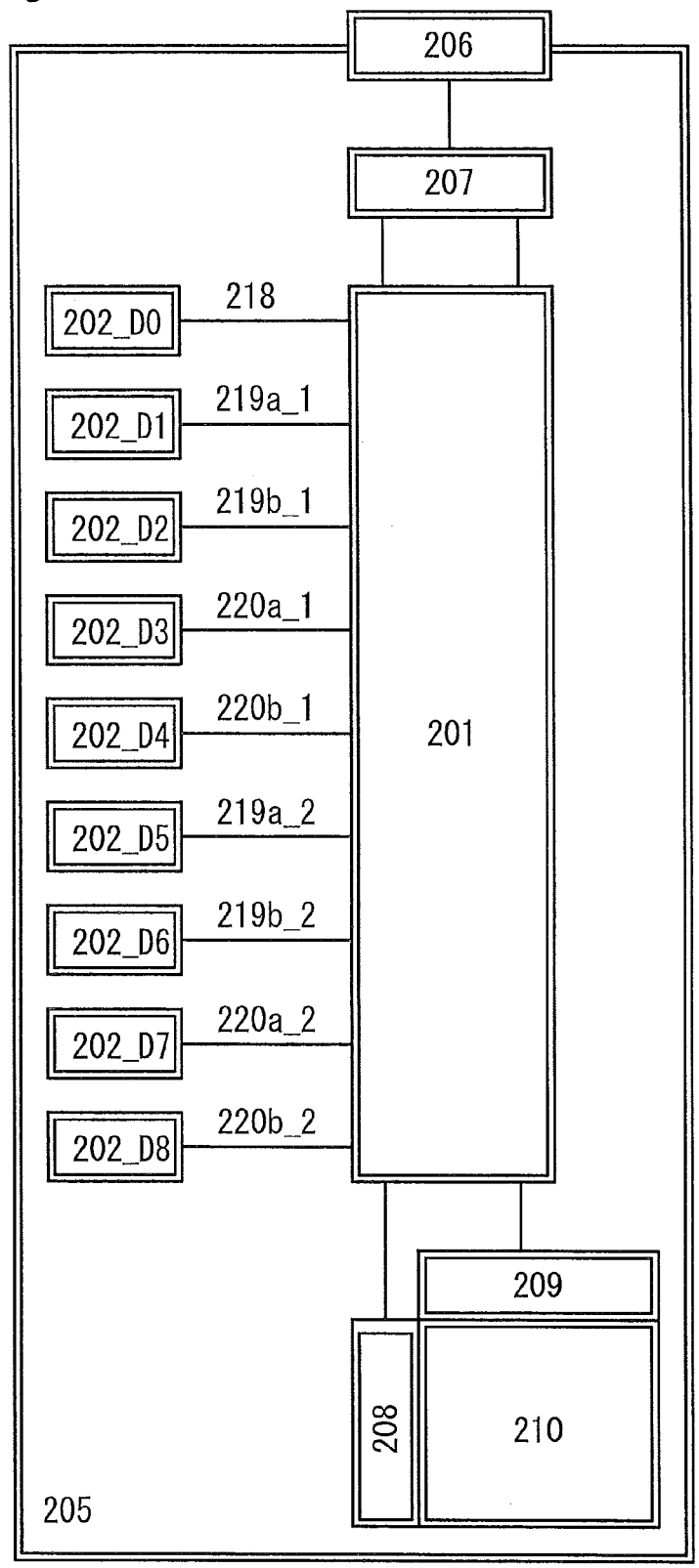
FIG. 6 shows examples of circuits of the present invention.

Description is made below with reference to FIG. 6. FIG. 6 shows an example of inhibiting writing of data to two memory cells in which a row address and a column address are each described with 2 bits. Nine inspection pads 202_D0, 202_D1, 202_D2, 202_D3, 202_D4, 202_D5, 202_D6, 202_D7, and 202_D8 are prepared. Then, writing inhibit enable data 218 is input to the inspection pad 202_D0. MSB of column address data of a first memory cell is input to the inspection pad 202_D1. LSB of the column address data of the first memory cell is input to the inspection pad 202_D2. MSB of row address data of the first memory cell is input to the inspection pad 202_D3. LSB of the row address data of the first memory cell is input to the inspection pad 202_D4. MSB of column address data of a second memory cell is input to the inspection pad 202_D5. LSB of the column address data of the second memory cell is input to the inspection pad 202_D6. MSB of row address data of the second memory cell is input to the inspection pad 202_D7. LSB of the row address data of the second memory cell is input to the inspection pad 202_D8.

The data input to these inspection pads are sent to the writing inhibit circuit 201 as the writing inhibit enable data 218, first writing inhibit column address data 219*a*_1, first writing inhibit column address data 219*b*_1, first writing inhibit row address data 220*a* 1, first writing inhibit row address data 220*b*_1, second writing inhibit column address data 219*a*_2, second writing inhibit column address data 219*b*_2, second writing inhibit row address data 220*a* 2, and second writing inhibit row address data 220*b*_2. As the writing inhibit circuit 201, a circuit which can inhibit writing of data to two memory cells and is similar to that described in Embodiment 4 may be used, for example. Needless to say, another circuit may also be used.

In the example in FIG. 6, the number of memory cells in which data writing is inhibited is two; however, data writing to a larger number of memory cells can be inhibited when more inspection pads are used.

This application is based on Japanese Patent Application serial No. 2010-183748 filed with Japan Patent Office on Aug. 19, 2010, the entire contents of which are hereby incorporated by reference.

What is claimed is:

1. A method for inspecting a semiconductor device comprising the steps of:
    storing address data, of a memory cell in which data writing is inhibited, into a register;
    comparing an output of the register with an output of a main logic circuit in a writing inhibit circuit, and then outputting a signal, thereby inspecting a redundant function; and
    replacing the memory cell with a redundant memory cell in the case where writing data to the memory cell has failed,
    wherein signals inputted to the register include writing inhibit enable data, writing inhibit column address data, and writing inhibit row address data.

2. A semiconductor device comprising:
    a main logic circuit that replaces a memory cell with a redundant memory cell in the case where writing of data to the memory cell has failed;
    a register that stores address data of a memory cell in which data writing is inhibited; and
    a writing inhibit logic circuit that compares an output of the register with an output of the main logic circuit and outputs a signal,
    wherein signals inputted to the register include writing inhibit enable data, writing inhibit column address data, and writing inhibit row address data.

3. The semiconductor device according to claim 2, further comprising a memory device including a writing circuit.

4. The semiconductor device according to claim 2, further comprising any one of a DRAM, an SRAM, an OTPROM, an EPROM, an FeRAM, an MRAM, and a PRAM.

5. The semiconductor device according to claim 2, further comprising an inspection pad for storing data to the register by probing.

6. The semiconductor device according to claim 2, wherein the register includes a D flip-flop circuit.

7. A semiconductor device comprising:
    a main logic circuit that replaces a memory cell with a redundant memory cell in the case where writing of data to the memory cell has failed;
    a register that stores address data of a memory cell in which data writing is inhibited; and
    a writing inhibit logic circuit that compares an output of the register with an output of the main logic circuit and outputs a signal,
    wherein signals inputted to the register include writing inhibit enable data, writing inhibit column address data, and writing inhibit row address data, and wherein the writing inhibit logic circuit includes two XNOR gates, a NAND gate, and an AND gate.

8. The semiconductor device according to claim 7, further comprising a memory device including a writing circuit.

9. The semiconductor device according to claim 7, further comprising any one of a DRAM, an SRAM, an OTPROM, an EPROM, an FeRAM, an MRAM, and a PRAM.

10. The semiconductor device according to claim 7, further comprising an inspection pad for storing data to the register by probing.

11. The semiconductor device according to claim 7, wherein the register includes a D flip-flop circuit.

* * * * *